United States Patent [19]
Seo et al.

[11] Patent Number: 5,796,668
[45] Date of Patent: Aug. 18, 1998

[54] INTEGRATED CIRCUIT MEMORY DEVICES HAVING REDUCED WRITE CYCLE TIMES AND RELATED METHODS

[75] Inventors: Dong-Il Seo; Hong-Sun Hwang, both of Kyungki-do, Rep. of Korea

[73] Assignee: Samsung Electronics Co., Ltd., Suwon, Rep. of Korea

[21] Appl. No.: 709,622

[22] Filed: Sep. 6, 1996

[30] Foreign Application Priority Data

Sep. 6, 1995 [KR] Rep. of Korea .................. 95-29237

[51] Int. Cl.$^6$ ................................................ G11C 8/00
[52] U.S. Cl. .............. 365/207; 365/230.06; 365/189.01
[58] Field of Search ................... 365/189.01, 149, 365/189.05, 207, 230.06

[56] References Cited

U.S. PATENT DOCUMENTS

| | | | |
|---|---|---|---|
| 4,764,900 | 8/1988 | Bader et al. | 365/225.6 |
| 4,901,282 | 2/1990 | Kobayashi | 365/233 |
| 4,939,691 | 7/1990 | Mizukami et al. | 365/189.01 |
| 4,954,992 | 9/1990 | Kumanoya et al. | 365/189.01 |
| 5,003,510 | 3/1991 | Kamisaki | 365/230.03 |
| 5,111,433 | 5/1992 | Miyamoto | 365/201 |
| 5,291,447 | 3/1994 | Kodama et al. | 365/207 |
| 5,323,345 | 6/1994 | Ohsawa | 365/189.01 |
| 5,345,574 | 9/1994 | Sakurada et al. | 365/222 |
| 5,539,700 | 7/1996 | Kawamara et al. | 365/203 |
| 5,659,507 | 8/1997 | Yabe et al. | 365/220 |

*Primary Examiner*—Tan T. Nguyen
*Attorney, Agent, or Firm*—Myers Bigel Sibley & Sajovec

[57] ABSTRACT

An integrated circuit memory device includes a plurality of memory cells arranged in an array of rows and columns, a plurality of word lines wherein each of the word lines is associated with a predetermined row of the memory cells, and a plurality of common lines wherein each of the column lines is associated with a predetermined column of the memory cells. Each of a plurality of sense amplifiers is associated with a respective column line and each of the sense amplifiers detects a voltage difference between a pair of bit lines for the respective column and amplifies the voltage difference. A row decoder selects one of the word lines in response to a row address input during a write operation. An input/output driver receives data input during the write operation, and each of a plurality of input/output gates is connected between the input/output driver and a respective one of the column lines. A column decoder activates one of the input/output gates before the sense amplifier senses and amplifies the voltage difference. Related methods are also disclosed.

8 Claims, 5 Drawing Sheets

INTEGRATED CIRCUIT MEMORY DEVICES HAVING REDUCED WRITE CYCLE TIMES AND RELATED METHODS

FIELD OF THE INVENTION

The present invention relates to the field of integrated circuits and more particularly to the field of integrated circuit memory devices.

BACKGROUND OF THE INVENTION

As the functionality and bandwidth of computer systems have increased, it has become desireable to reduce the time required to perform a read cycle of a memory device. In particular, there have been efforts to reduce read cycle times by reducing the access time. Accordingly, memory devices with reduced read cycle times have been developed which provide a fast page mode of operation. In addition, memory devices have been developed with extended data out page modes of operation and pipe-lined burst type page modes of operation.

An operation timing diagram of a read/write cycle for a memory device operating according to a conventional page mode of operation is shown in FIG. 1. The first cycle time "tcsh" is the time required from a falling of the $\overline{RAS}$ signal to a rising of the $\overline{CAS}$ signal during a page cycle. During this first cycle time "tcsh", a specific word line is activated in response to a row address, and a memory cell of a corresponding address is read or written to in response to the received first column address YO$\phi$. During the second time cycle "tpc", a column address is received and a read or write operation is then performed. Accordingly, there is a problem in that the first cycle time "tcsh" is longer than the second cycle time "tpc".

A block diagram of a write path for a conventional dynamic random access memory DRAM is illustrated in FIG. 2, and a timing diagram of a first cycle of a write operation is shown in FIG. 3. When a row address strobe signal $\overline{RAS}$ is enabled, an external row address signal is received and a specific word line is activated. The memory cell data is then transmitted to a bit line and the potential of the bit line is amplified by a sense amplifier. When a write enable signal $\overline{WE}$ and a column address strobe signal $\overline{CAS}$ are enabled, a write control signal $\phi$WR is enabled and input data $D_{IN}$ is transmitted to the data lines DB and $\overline{DB}$ via the data input buffer $D_{IN}$BUFFER.

A circuit diagram of a column decoder according to the prior art is illustrated in FIG. 4. This column decoder is activated by a signal $\phi$CDE, and the signal $\phi$CDE is enabled by a row control circuit and a column address buffer output signal CA0-CAn. The column decoder enables a column select line CSL. Because the column decoder enable signal $\phi$CDE is enabled after operation of the sense amplifier, the column select line CSL is enabled after the sensing operation for the bit line is performed, and the input data is thus transmitted from an input/output line I/O to a respective bit line after the operation of the sense amplifier. As shown, the bit line and the input/output line are connected to each other through an input/output gate transistor. The data of the bit line is transmitted to the cell, and the writing operation is thus completed.

In conventional memory devices, the column select line CSL is enabled after the operation of the sense amplifier as discussed above. Accordingly, the time required to write input data into a memory cell may be unnecessarily delayed. Accordingly, there continues to exist a need in the art for improved memory devices and methods of operation.

SUMMARY OF THE INVENTION

It is therefore an object of the present invention to provide improved integrated circuit memory devices and methods.

It is another object of the present invention to provide integrated circuit memory devices and methods having a reduced write cycle times.

These and other objects are provided according to the present invention by integrated circuit memory devices and methods wherein input data is transmitted from an input/output line to a respective bit line without waiting to sense and amplify a data value previously stored in the respective memory cell. Accordingly, the time required to perform a write operation can be reduced.

In particular, an integrated circuit memory device according to the present invention includes a plurality of memory cells arranged in an array of rows and columns, a plurality of word lines wherein each of the word lines is associated with a predetermined row of memory cells, and a plurality of column lines wherein each of the column lines is associated with a predetermined column of the memory cells. Each of a plurality of sense amplifiers is associated with a respective column line, and each of the sense amplifiers detects a voltage difference between a pair of bit lines for the respective column and amplifies the voltage difference.

A row decoder selects one of the word lines in response to a row address input during a write operation, and an input/output driver receives data input. Each of a plurality of input/output gates is connected between the input/output driver and a respective one of the column lines, and a column decoder activates one of the input/output gates before the sense amplifier senses and amplifies the voltage difference. More particularly, the column decoder activates one of the input/output gates in response to a write control signal and a column address during the write operation. The write control signal can be enabled by a write enable signal.

According to an alternate aspect of the present invention, a method is provided for writing data into a predetermined memory cell of an integrated circuit memory device having a plurality of memory cells arranged in an array of rows and columns, a plurality of word lines wherein each of the word lines is associated with a predetermined row of the memory cells, and a plurality of column lines wherein each of the column lines is associated with the predetermined column of the memory cells. This method includes the steps of selecting a word line associated with the predetermined memory cell in response to a row address provided during a write operation, and receiving data input to be written into the predetermined memory cell. This data input is provided to a column line associated with the predetermined memory cell without sensing and amplifying a data value previously written to the predetermined memory cell. The step of providing the data input can occur in response to a write control signal and a column address during the data write operation.

According to the memory devices and methods of the present invention, the time required to perform a write operation for an integrated circuit memory device can be reduced.

DETAILED DESCRIPTION

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
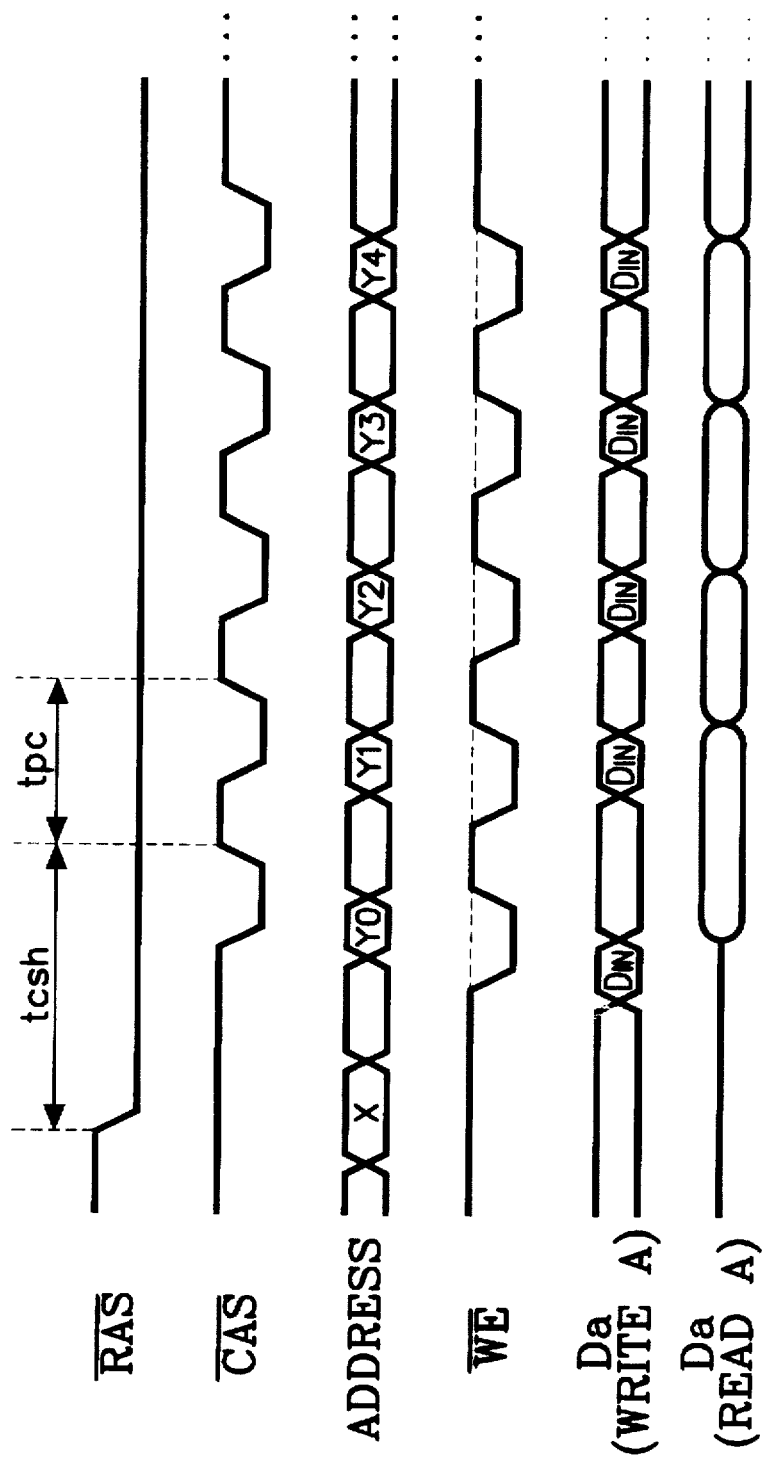
FIG. 1 is a timing diagram illustrating the operation of a memory device having a page mode read/write cycle according to the prior art.
Figure 2:
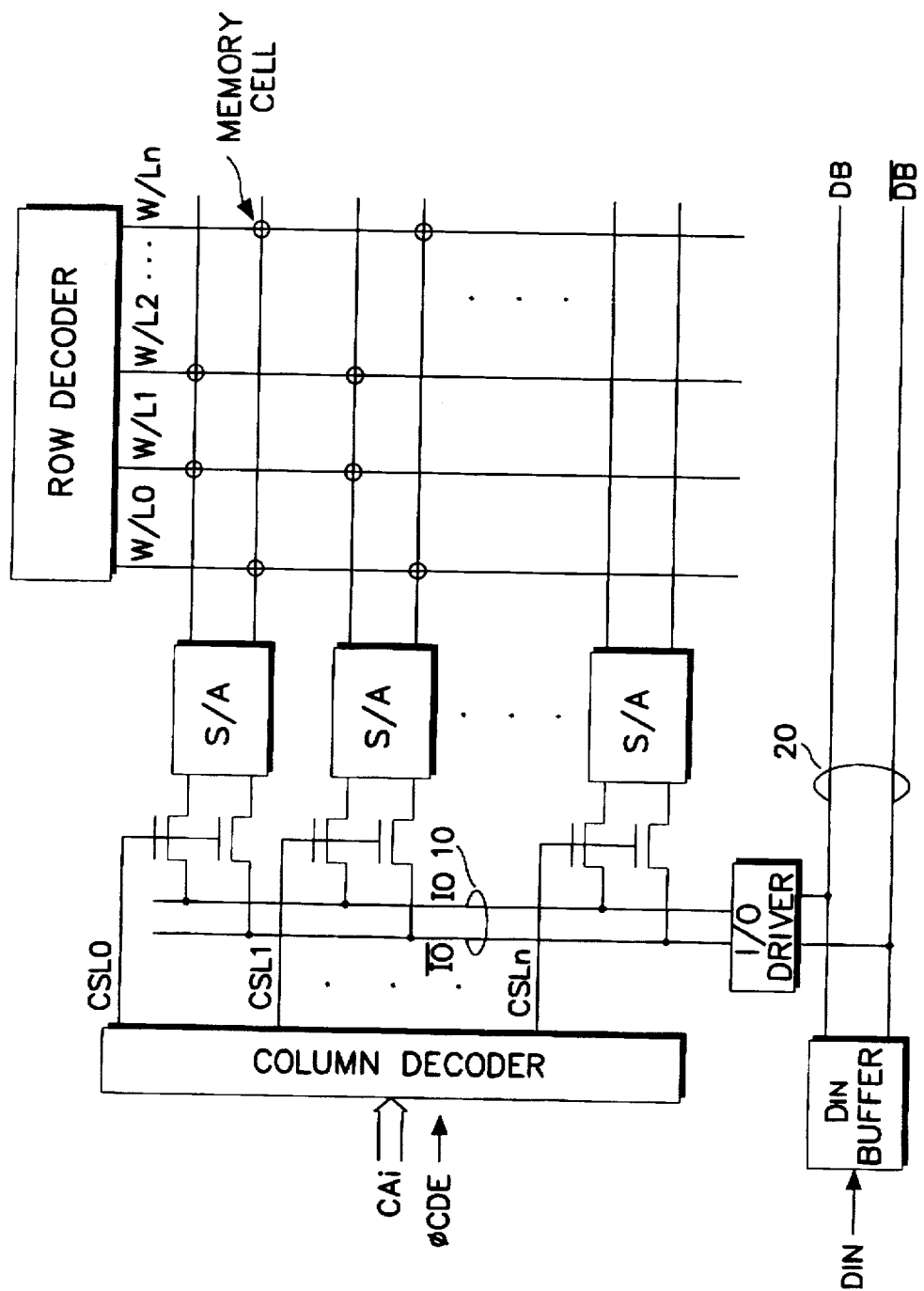
FIG. 2 is a block diagram illustrating the write path of a dynamic random access memory according to the prior art.
Figure 3:
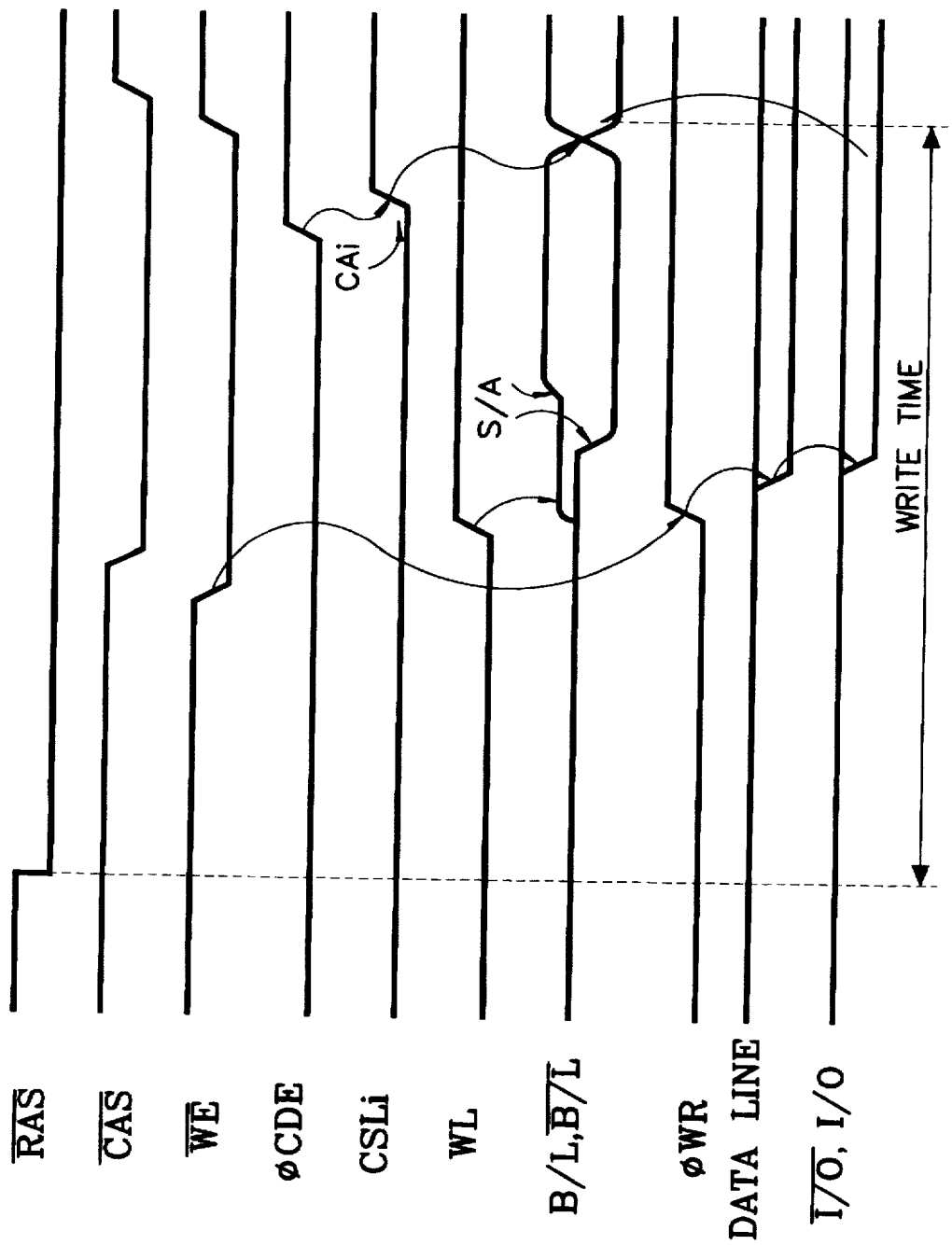
FIG. 3 is a timing diagram illustrating a write operation for an integrated circuit memory device according to the prior art.
Figure 4:
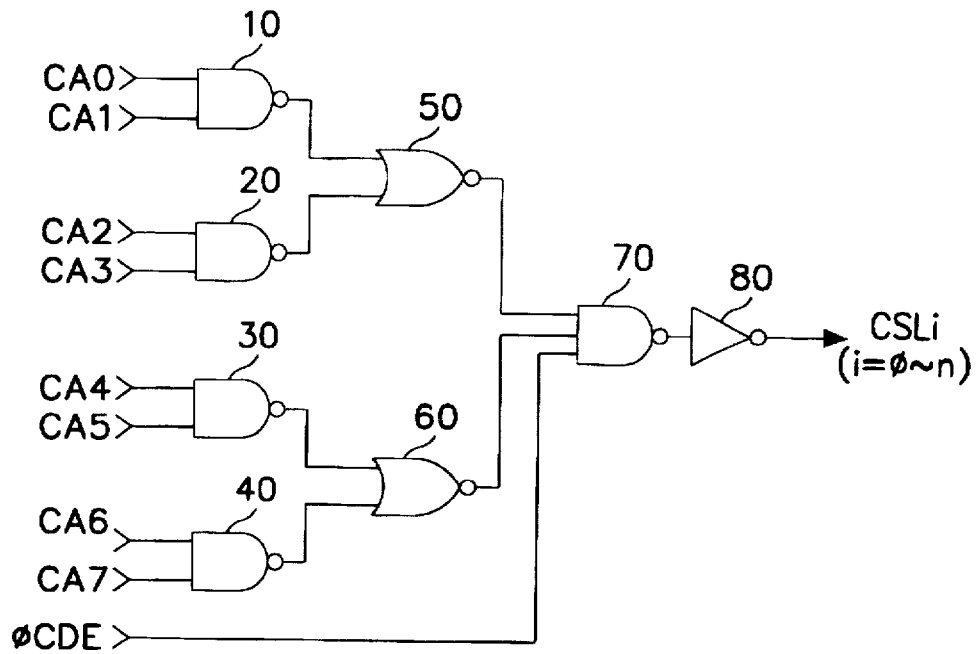
FIG. 4 is a circuit diagram illustrating a column decoder for an integrated circuit memory device according to the prior art.
Figure 5:
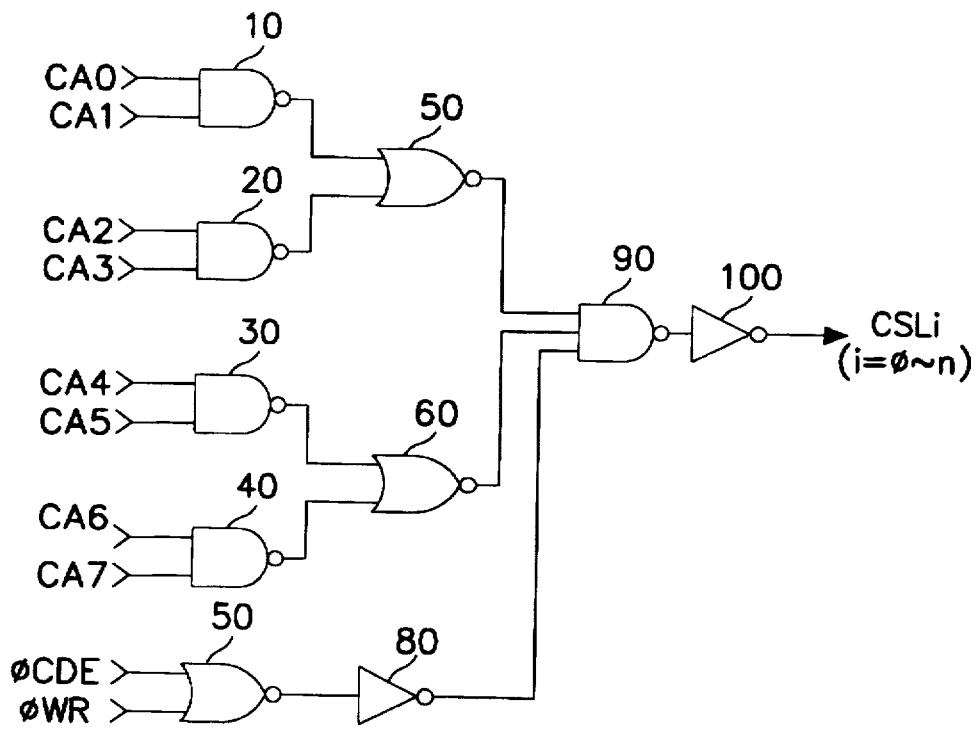
FIG. 5 is a circuit diagram illustrating a column decoder for an integrated circuit memory device according to the present invention.
Figure 6:
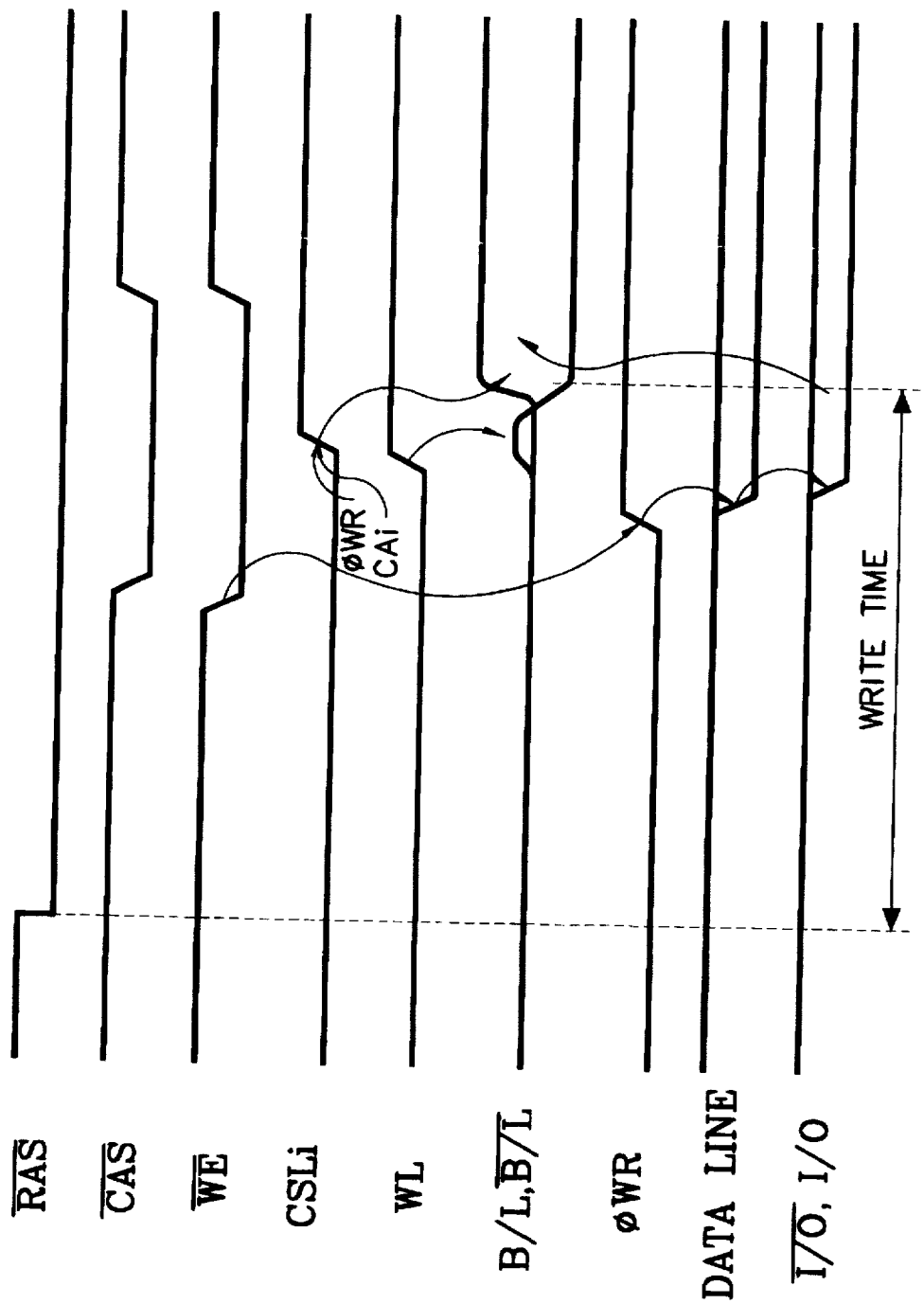
FIG. 6 is a timing diagram illustrating a write operation for an integrated circuit memory device according to the present invention.

A circuit diagram of a column decoder according to the present invention is illustrated in FIG. 5, and a timing diagram illustrating a write operation for an integrated circuit memory device according to the present invention is illustrated in FIG. 6. When the row address strobe signal $\overline{RAS}$ is enabled, a row address buffer receives a row address generated by a row control circuit, and an output of the row address buffer is transmitted to the row decoder thus activating a respective word line.

Upon activation of the word line, a data bit from a memory cell is transmitted to a respective bit line, and a potential of the bit line is amplified by a sense amplifier. Furthermore, when the write enable signal $\overline{WE}$ and a column address strobe signal $\overline{CAS}$ are enabled, a write control signal φWR is enabled and the data input buffer $D_{IN}$BUFFER operates. Input data $D_{IN}$ is thereby transmitted to the data lines DB and $\overline{DB}$. The respective input/output gate transistor allows the data from the data lines IO and $\overline{IO}$ to be transmitted to respective bit lines. The input/output gate transistor is enabled by a signal generated by the column decoder and transmitted by the respective column selection line CSL.

According to the present invention, the column decoder is enabled by the output signal φCDE of the row control circuit which is enabled after the sensing operation and the column address, or the column decoder is enabled by the write control signal φWR in the column address. In other words, the column decoder is enabled by the output signal φCDE of the row control circuit and the column address during a read operation. The column decoder is alternately enabled by the write control signal φWR and the column address during a write operation. Accordingly, when the write control signal φWR and a predetermined column address are enabled during a write operation, a respective column selection line CSL is enabled and data from the input/output lines is written to a respective memory cell via a respective bit line. Accordingly, the column decoder is enabled and a writing operation is performed prior to a sensing operation for a bit line pair. The present invention thus reduces the time required to perform a memory write cycle when compared to prior art memory devices and methods wherein the column decoder is activated after a potential of the bit line is sensed and amplified.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit dynamic random access memory device comprising:

a plurality of memory cells arranged in an array of rows and columns wherein each of said memory cells includes a memory cell capacitor and a memory cell access transistor;

a plurality of word lines wherein each of said word lines is associated with a predetermined row of said memory cells and wherein each of said word lines is connected to a gate of each of said memory cell access transistors of said predetermined row of said memory cells;

a plurality of column lines wherein each of said column lines is associated with a predetermined column of said memory cells;

a plurality of sense amplifiers wherein each of said sense amplifiers is associated with a respective column line and wherein each of said sense amplifiers detects a voltage difference between a pair of bit lines for said respective column of memory cells and amplifies said voltage difference during a read operation;

a row decoder which selects one of said word lines in response to a row address input during write and read operations;

an input/output driver which receives data input during the write operation;

a plurality of input/output gates wherein each of said input/output gates is connected between said input/output driver and a respective one of said column lines; and a column decoder which activates one of said input/output gates without first sensing and amplifying said voltage difference using one of said sense amplifiers during the write operation;

wherein said column decoder activates one of said input/output gates in response to a write control signal and a column address during the write operation.

2. An integrated circuit dynamic random access memory device according to claim 1 wherein said write control signal is enabled by a write enable signal.

3. An integrated circuit dynamic random access memory device according to claim 1 wherein said column decoder activates one of said input/output gates after said sense amplifier senses and amplifies said voltage difference during the read operation.

4. An integrated circuit dynamic random access memory device according to claim 3 wherein said column decoder activates said input/output gate in response to a write control signal during the write operation and in response to a row control circuit output signal during the read operation.

5. A method for writing data into a predetermined memory cell of an integrated circuit dynamic random access memory device having a plurality of memory cells arranged in an array of rows and columns wherein each of the memory cells includes a memory cell capacitor and a memory cell access transistor, a plurality of word lines wherein each of said word lines is associated with a predetermined row of said memory cells and wherein each of said word lines is connected to a gate of each of said memory cell access transistors of the predetermined row of the memory cells.

and a plurality of column lines wherein each of said column lines is associated with a predetermined column of said memory cells, said method comprising the steps of:

selecting a word line associated with said predetermined memory cell in response to a row address provided during a data write operation;

receiving data input to be written into said predetermined memory cell; and providing said data input to a column line associated with said predetermined memory cell without first sensing and amplifying a data value previously written to said predetermined memory cell during the write operation;

wherein said step of providing said data input occurs in response to a write control signal and a column address during the data write operation.

6. A method according to claim 5 wherein said write control signal is enabled by a write enable signal.

7. A method according to claim 5 further comprising the step of providing data output from said column line associated with said predetermined memory cell after sensing and amplifying a data value previously written to said predetermined memory cell during the read operation.

8. A method according to claim 7 wherein said data is provided to said column line in response to a write control signal during the write operation and wherein said data is provided from said column line in response to a row control circuit output signal during the read operation.

* * * * *